(12) United States Patent
Hopstaken et al.

(10) Patent No.: US 9,203,022 B2
(45) Date of Patent: Dec. 1, 2015

(54) RESISTIVE RANDOM ACCESS MEMORY DEVICES WITH EXTREMELY REACTIVE CONTACTS

(71) Applicant: INTERNATIONAL BUSINESS MACHINES CORPORATION, Armonk, NY (US)

(72) Inventors: Marinus J. Hopstaken, Carmel, NY (US); Jeehwan Kim, White Plains, NY (US); Seyoung Kim, White Plains, NY (US); Mark B. Ritter, Sherman, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 8 days.

(21) Appl. No.: 13/948,723

(22) Filed: Jul. 23, 2013

(65) Prior Publication Data
US 2015/0028279 A1     Jan. 29, 2015

(51) Int. Cl.
*H01L 45/00*     (2006.01)

(52) U.S. Cl.
CPC ............ *H01L 45/1253* (2013.01); *H01L 45/08* (2013.01); *H01L 45/1233* (2013.01); *H01L 45/1266* (2013.01); *H01L 45/146* (2013.01); *H01L 45/16* (2013.01); *H01L 45/1608* (2013.01)

(58) Field of Classification Search
None
See application file for complete search history.

(56) References Cited

U.S. PATENT DOCUMENTS

| | | | |
|---|---|---|---|
| 7,235,407 B2 * | 6/2007 | Li et al. | 438/3 |
| 7,875,925 B2 | 1/2011 | Ino | |
| 8,362,454 B2 | 1/2013 | Lee et al. | |
| 2009/0114896 A1 * | 5/2009 | Kim et al. | 257/2 |
| 2012/0074372 A1 * | 3/2012 | Yang et al. | 257/4 |
| 2012/0305878 A1 * | 12/2012 | Miller et al. | 257/4 |
| 2013/0001743 A1 * | 1/2013 | Frank | 257/532 |

FOREIGN PATENT DOCUMENTS

| | | |
|---|---|---|
| CN | 102751437 A | 10/2012 |
| KR | 1020090108221 A | 10/2009 |
| KR | 100997214 B1 | 7/2010 |
| WO | WO2010038786 A1 | 4/2010 |
| WO | WO2010150957 A1 | 12/2010 |

* cited by examiner

*Primary Examiner* — Andres Munoz
(74) *Attorney, Agent, or Firm* — Tutunjian & Bitetto, P.C.

(57) ABSTRACT

A resistive switching device includes a first electrode and a transition metal oxide layer formed on the first electrode. An oxygen scavenging electrode is formed on the transition metal oxide wherein the oxygen scavenging electrode removes oxygen from the transition metal oxide layer to increase formation of oxygen vacancies in the transition metal oxide layer to enable a switching mode when a bias is applied between the first electrode and the oxygen scavenging electrode.

11 Claims, 4 Drawing Sheets

RESISTIVE RANDOM ACCESS MEMORY DEVICES WITH EXTREMELY REACTIVE CONTACTS

BACKGROUND

1. Technical Field

The present invention relates to memory devices, and more particularly to devices and methods for forming resistive random access memories with reactive contacts.

2. Description of the Related Art

Resistive random access memory (RRAM) is considered a promising technology for high-density and high-speed non-volatile memory applications. In RRAM cells, a dielectric layer, which is normally insulating, can be made to conduct through a conduction path or conducting filament formed after application of a sufficiently high voltage and current. The conduction path formation can arise from different mechanisms, including vacancy formation, defect generation, metal migration, phase change, etc. Once the conduction path is formed, it may be reset (disconnected, resulting in high resistance) or set (connected, resulting in lower resistance) by an appropriately applied voltage and current.

SUMMARY

A resistive switching device includes a first electrode and a transition metal oxide layer formed on the first electrode. An oxygen scavenging electrode is formed on the transition metal oxide. At the moment when the oxygen scavenging electrode is formed, the oxygen scavenging electrode removes oxygen from the transition metal oxide layer to increase the concentration of oxygen vacancies in the transition metal oxide layer to enable a switching mode.

A resistive switching device includes a first electrode and a transition metal oxide layer formed on the first electrode. An oxygen scavenging electrode is formed on the transition metal oxide wherein the oxygen scavenging electrode removes oxygen from the transition metal oxide layer to increase formation of oxygen vacancies in the transition metal oxide layer to enable a switching mode when a bias is applied between the first electrode and the oxygen scavenging electrode.

A resistive random access memory cell includes a first electrode formed on a substrate and a transition metal oxide layer formed on the first electrode. An oxygen scavenging electrode is formed on the transition metal oxide. A biasing circuit is integrated on the substrate, coupled to the first electrode and the oxygen scavenging electrode and configured to apply a bias voltage between the first electrode and the oxygen scavenging electrode. When the device is biased, the oxygen scavenging electrode removes oxygen from the transition metal oxide layer to increase formation of oxygen vacancies in the transition metal oxide layer to enable a switching mode in accordance with the bias voltage.

A method for forming a resistive switching device includes forming a first electrode; forming a transition metal oxide layer on the first electrode; forming an oxygen scavenging electrode on the transition metal oxide; and controlling oxygen scavenging by the oxygen scavenging electrode by adjusting formation properties of the oxygen scavenging electrode such that when the device is biased, the oxygen scavenging electrode removes oxygen from the transition metal oxide layer to increase formation of oxygen vacancies in the transition metal oxide layer to enable a switching mode.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
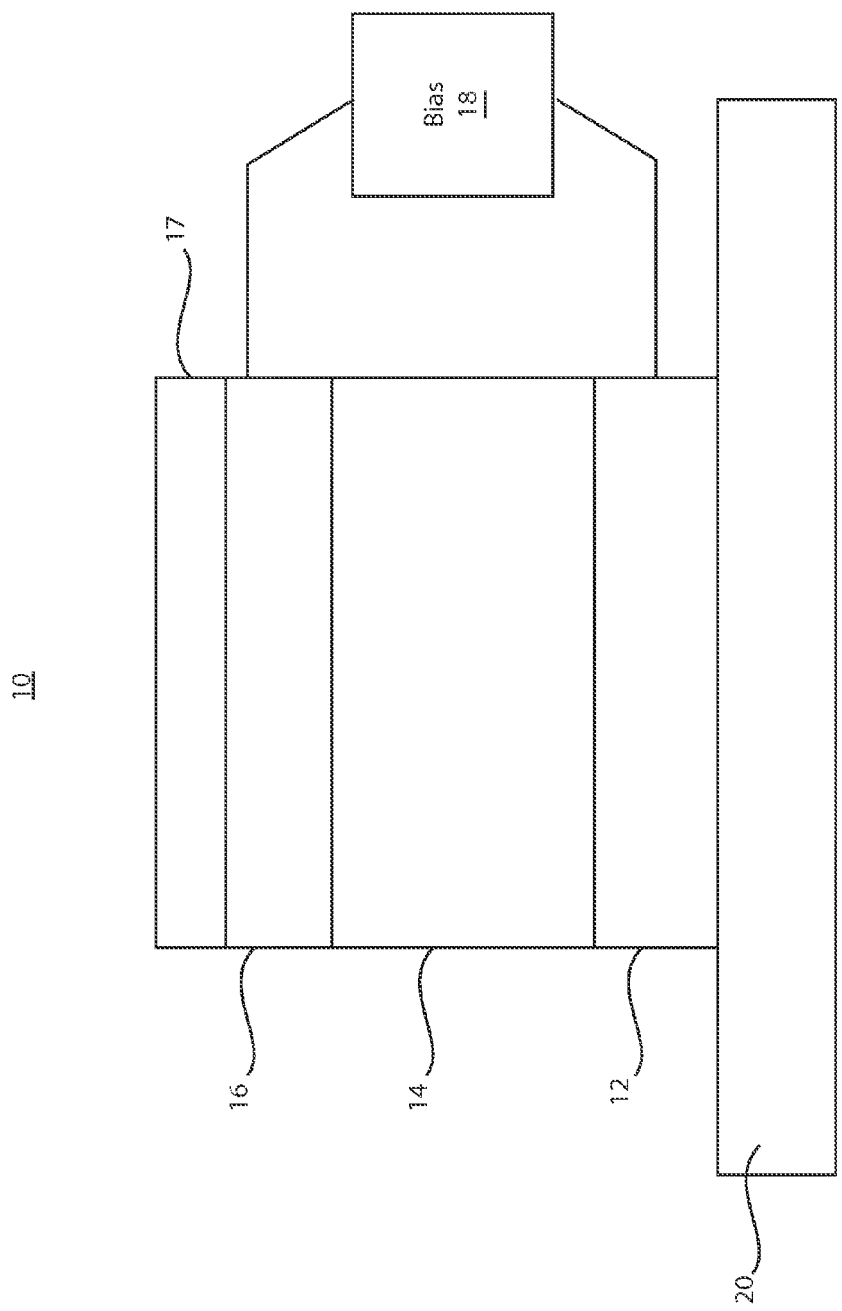
FIG. 1 is a cross-sectional view of a resistive switching device in accordance with the present principles.

In accordance with the present principles, a resistive switching device in transition metal oxide (TMO) based devices is disclosed. In one embodiment, the device includes a switching mechanism that is attributed to conducting channel formation in the TMO layer by oxygen vacancy migration. In accordance with the present principles, one of the electrodes of the device is formed with an extremely reactive oxygen scavenging material configured to consume or draw oxygen from the TMO. In one particularly useful embodiment, the electrode includes erbium (Er), which is a highly oxygen-scavenging material. The Er electrode consumes oxygen in the switching dielectric with which it is in contact. This creates oxygen vacancies in the TMO layer.

The resistive switching device may include resistive random access memory (RRAM) cells. By employing Er or similar materials as an electrode in RRAM devices, oxygen vacancy in TMO can be created. Oxygen concentration can be controlled and/or adjusted in the TMO by, for example, changing a thickness of Er and/or by controlling the deposition conditions such as pressure and temperature, and/or by post-deposition annealing of the Er.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative resistive switching device 10 is shown in accordance with one embodiment. In a simple form, the device includes a first electrode 12, which may include any conductive material such as Pt, Mo, W, Cu, Ag, Au, TiN, Pd, etc. Electrode 12 may be formed on a substrate 20 for an integrated circuit or other device. Electrode 12 may be deposited by a chemical vapor deposition process (CVD), a sputtering process, evaporation, a plasma enhanced CVD (PECVD), etc.

The electrode 12 may include a thickness of between about 20 nm to about 2 microns, although other thicknesses may be employed.

A transition metal oxide (TMO) 14 is deposited on the electrode 12. The TMO may include a high dielectric constant (high-k) material such as, e.g., hafnium dioxide, aluminum oxide, zirconium dioxide, silicon dioxide, or other oxides. The TMO 14 may be deposited by an atomic layer deposition (ALD), chemical vapor deposition process (CVD), a plasma enhanced CVD (PECVD), etc. The TMO 14 may include a thickness of between about 1 nm to about 100 nm, although other thicknesses may be employed.

A second electrode 16 is formed on the TMO 14. The second electrode 16 includes an extremely reactive oxygen scavenging material, such as, e.g., Er, La, Y, Yb, Sc, Ce, Pr, Nd, Sm, Dy, Ho, Tm, Yb, Lu or other rare earth elements although other conductors such as, e.g., Hf, Ni, Al, Ti, Ca, Mg, Zr, etc. or there alloys may be employed. Electrode 16 may be deposited by a chemical vapor deposition process (CVD), a sputtering process, evaporation, a plasma enhanced CVD (PECVD), etc. The electrode 16 may include a thickness of between about 2 nm to about 2 microns, although other thicknesses may be employed. The device 10 may be employed as a RRAM device where a potential is applied across the TMO 14 using a bias circuit or device 18 to generate a potential difference between the electrodes 12 and 16. The bias circuit 18 may be integrated on the substrate 20.

The thickness of the electrode 16 has an impact on its oxygen scavenging characteristics. Thicker electrode layers 16 provide a greater oxygen scavenging capacity. In addition, a post anneal process of the electrode 16 may permit greater oxygen scavenging properties of the electrode 16.

In one embodiment, the anneal process may include a temperature between about 100 degrees C. to about 500 degrees C. for between 10 s and 60 minutes. Other temperatures and durations may also be employed.

An optional capping layer 17 may be formed on layer 16. The capping layer 17 includes a conductive material, such as e.g., TiN, TaN, W, Ag, Au, etc. When layer 16 is thin, the additional capping layer 17 provides a more reliable contact by enhancing conductive properties. Also, the optional capping layer 17 may also serve as an oxygen diffusion barrier to prevent oxidation of layer 16 by atmospheric oxygen.

Figure 2:
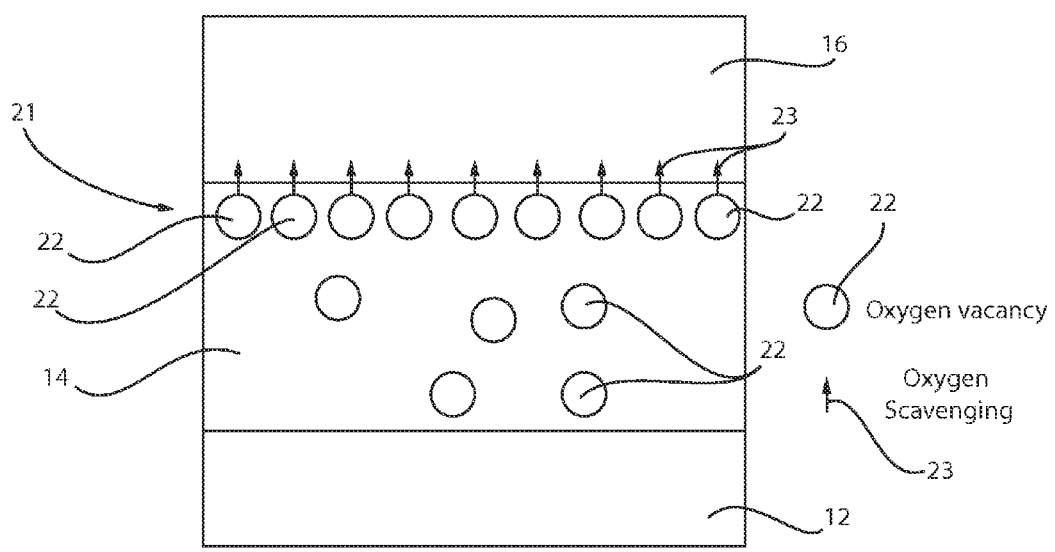
FIG. 2 is a cross-sectional view of a resistive switching device showing the formation of oxygen vacancies when biased in accordance with the present principles.

Referring to FIG. 2, a resistive switching mechanism in TMO-based RRAMs is attributed to conducting channel 21 formation in the TMO layer 14 by oxygen vacancy migration. Oxygen vacancies 22 are illustrated by open circles, and arrows 23 indicate oxygen scavenging (not movement of oxygen vacancies out of the layer 14). In accordance with the present principles, the oxygen scavenging material of electrode 16 (e.g., erbium (Er) a highly oxygen-scavenging material), consumes oxygen in the switching dielectric (TMO layer 14) at an interface between the electrode 16 and the TMO layer 14. This creates oxygen vacancies 22 in the TMO layer 14.

By using, e.g., Er as an electrode of RRAM devices, oxygen vacancies 22 can be created in the TMO layer 14. The oxygen vacancy concentration or density can be controlled in the TMO layer 14 by, for example, changing the thickness of the electrode 16, changing the deposition conditions, such as, pressure and temperature, and post-deposition annealing of the electrode 16. The oxygen vacancies 22 permit the formation of a selectively activated (e.g., using biasing) conductive channel between the electrodes 12 and 16 through the TMO layer 14.

Figure 3A:
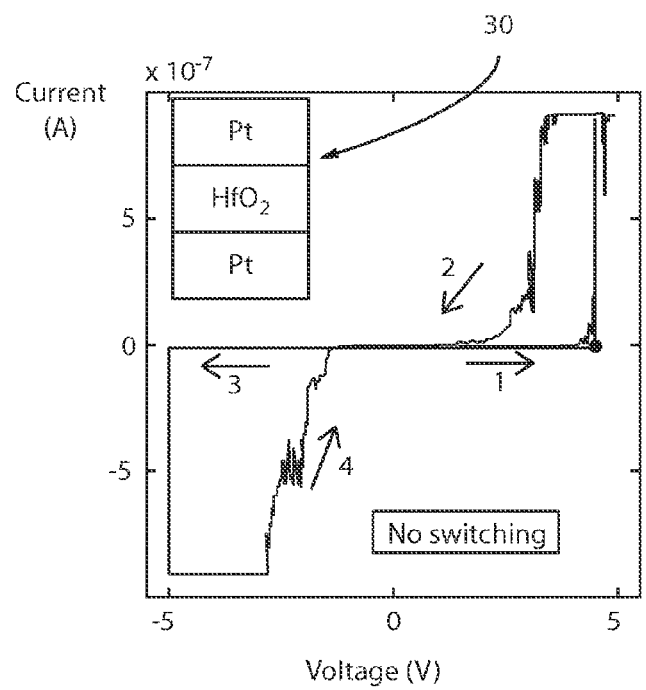
FIG. 3A shows a comparison structure including inert Pt electrodes and a graph of current (A) versus voltage (V) showing no resistive switching.

Referring to FIG. 3A, a graph shows current (A) versus voltage (V) for a Pt—HfO$_2$—Pt device 30. The device 30 was tested and displayed no resistive switching when high positive and negative voltages were applied. The high positive potential, +5V, applied to the device 30 shows no switching in the device resistance (arrow 1) except a transient increase of leakage current due to the soft-breakdown and stress applied to the HfO$_2$ layer (arrow 2). The device 30 underwent a similar non-switching response with the high negative potential. The device 30 showed very low current (arrow 3) until the soft-breakdown and subsequent stress current appeared in a transient manner (arrow 4). FIG. 3A confirmed that there is no resistance switching observed in the Pt—HfO$_2$—Pt device 30. The top Pt electrode is inert with regard to oxygen scavenging and has been provided to highlight differences in accordance with the present principles as will be described with reference to FIG. 3B.

Figure 3B:
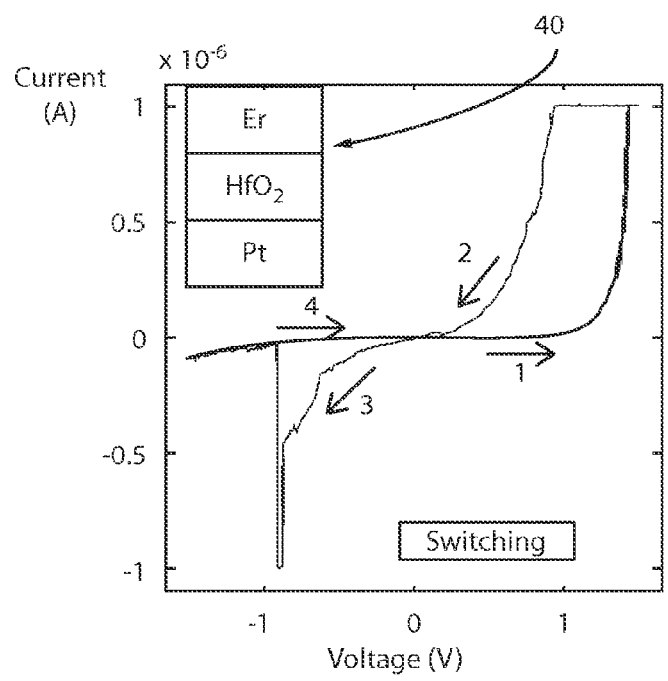
FIG. 3B shows a structure including an inert Er electrode and a graph of current (A) versus voltage (V) showing resistive switching in accordance with the present principles.

Referring to FIG. 3B, a graph shows current (A) versus voltage (V) for an Er—HfO$_2$—Pt device 40. The device 40 shows switching of device resistance between a high resistance state (HRS) and low resistance state (LRS). A significant decrease in the device resistance is observed after applying a positive bias of 1.5 V (arrow 1), and the resistance of device 40 is switched to a low resistance state confirmed by high current (arrow 2). In the subsequent negative voltage sweep, the device 40 switches back to the high resistance state at the applied negative bias of –0.9V confirmed by a sudden decrease of the device current (arrow 3), and low current flow afterward (arrow 4). This resistance switching can be utilized to implement memory devices with two or more distinct states.

The oxygen scavenging material (e.g., Er) enables/enhances resistive switching in TMO-based RRAM devices by scavenging oxygen in the TMO layer and creating mobile oxygen vacancies. Devices 40 with an Er—HfO$_2$—Pt structure show bipolar resistive switching, while a device with inert Pt contacts in Pt—HfO$_2$—Pt does not show any switching.

Figure 4:
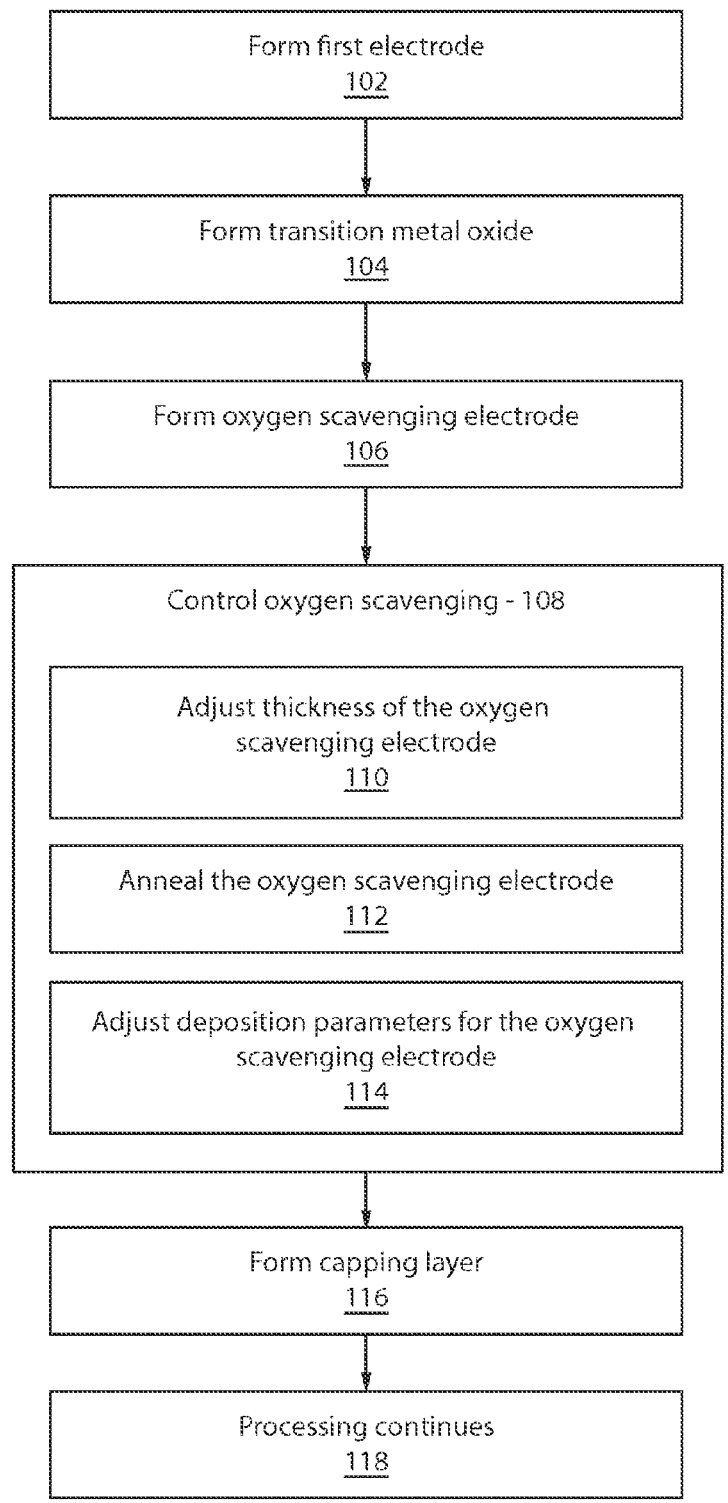
FIG. 4 is a block/flow diagram showing a method for forming a resistive switching device in accordance with illustrative embodiments.

Referring to FIG. 4, a block/flow diagram shows a method for forming a resistive switching device in accordance with illustrative embodiments. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, a first electrode is formed. Any suitable conductor may be employed. In block 104, a transition metal oxide layer is formed on the first electrode. The transition metal oxide layer may include hafnium dioxide, although other oxides may be employed. In block 106, an oxygen scavenging electrode is formed on the transition metal oxide. The oxygen scavenging electrode may include erbium although other materials may be employed.

In block 108, oxygen scavenging is controlled in the oxygen scavenging electrode such that when the device is biased, the oxygen scavenging electrode removes oxygen from the transition metal oxide layer to increase formation of oxygen vacancies in the transition metal oxide layer to enable a switching mode when the bias is applied. The bias and the reverse bias may include a same magnitude and opposite sign.

In block 110, oxygen scavenging is controlled by adjusting a thickness of the oxygen scavenging electrode. The oxygen scavenging electrode may have a thickness adjusted between 2 nm to 50 nm, although other thickness may be employed. In block 112, controlling oxygen scavenging includes annealing the oxygen scavenging layer to drive off oxygen. In block 114, controlling oxygen scavenging includes adjusting at least one of a pressure and temperature during the deposition of the oxygen scavenging electrode. The pressure and temperature adjustments are determined based on the material employed and the oxygen vacancy density desired. In block 116, a capping layer may be formed on the oxygen scavenging electrode.

Processing can continue in block 118, with the formation of metallizations, interlevel dielectric layers, biasing circuits, etc.

Having described preferred embodiments for resistive random access memory devices with extremely reactive contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A resistive switching device, comprising:

a first electrode selected from the group consisting of Pt, Mo, W, Cu, Ag, Au, TiN, Pd and combinations thereof;

a transition metal oxide layer formed on and physically contacting the first electrode, the transition metal oxide layer having a composition selected from the group consisting of hafnium dioxide, zirconium dioxide, and combinations thereof; and an oxygen scavenging electrode formed on the transition metal oxide, the oxygen scavenging electrode having a different composition than the first electrode, the oxygen scavenging electrode selected from the group consisting of Er, La, Y, Yb, Sc, Ce, Pr, Nd, Sm, Dy, Ho, Tm, Lu and combinations thereof, wherein the oxygen scavenging electrode removes oxygen from the transition metal oxide layer to increase formation of oxygen vacancies in the transition metal oxide layer to enable a switching mode when a bias is applied between the first electrode and the oxygen scavenging electrode.

2. The device as recited in claim 1, wherein the oxygen scavenging electrode includes erbium.

3. The device as recited in claim 1, wherein the transition metal oxide layer includes hafnium dioxide.

4. The device as recited in claim 1, wherein the resistive switching device forms a resistive random access memory cell.

5. The device as recited in claim 1, wherein the bias includes a plurality of voltages and the resistive switching device stores at least two states corresponding to said plurality of voltages.

6. The device as recited in claim 1, wherein the oxygen scavenging electrode includes a thickness of between about 1 nm and about 100 nm.

7. A resistive random access memory cell, comprising:
- a first electrode formed on a substrate, the first electrode selected from the group consisting of Pt, Mo, W, Cu, Ag, Au, TiN, Pd and combinations thereof;
- a transition metal oxide layer having a composition selected from the group consisting of hafnium dioxide, zirconium dioxide, silicon dioxide and combinations thereof, the transition metal oxide layer formed on and physically contacting the first electrode;
- an oxygen scavenging electrode formed on the transition metal oxide, the oxygen scavenging electrode having a different composition than the first electrode, the oxygen scavenging electrode selected from the group consisting of Er, La, Y, Yb, Sc, Ce, Pr, Nd, Sm, Dy, Ho, Tm, Lu and combinations thereof; and
- a biasing circuit integrated on the substrate and coupled to the first electrode and the oxygen scavenging electrode and configured to apply a bias voltage between the first electrode and the oxygen scavenging electrode wherein, when the device is biased, the oxygen scavenging electrode removes oxygen from the transition metal oxide layer to increase formation of oxygen vacancies in the transition metal oxide layer to enable a switching mode in accordance with the bias voltage.

8. The cell as recited in claim 7, wherein the oxygen scavenging electrode includes erbium.

9. The cell as recited in claim 7, wherein the transition metal oxide layer includes hafnium dioxide.

10. The cell as recited in claim 7, wherein the bias voltage includes a plurality of voltages and the resistive random access memory cell stores at least two states corresponding to said plurality of voltages.

11. The cell as recited in claim 7, wherein the oxygen scavenging electrode includes a thickness of between about 1 nm and about 100 nm.

* * * * *